(12) United States Patent
Messier et al.

(10) Patent No.: US 8,144,040 B2
(45) Date of Patent: Mar. 27, 2012

(54) RANDOMIZATION OF SAMPLE WINDOW IN CALIBRATION OF TIME-INTERLEAVED ANALOG TO DIGITAL CONVERTER

(75) Inventors: Jason A. Messier, Medford, MA (US); Michael F. Lamenza, Belmont, MA (US)

(73) Assignee: Intersil Americas, Inc., Milpitas, CA (US)

( * ) Notice: Subject to any disclaimer, the term of this patent is extended or adjusted under 35 U.S.C. 154(b) by 0 days.

(21) Appl. No.: 12/749,822

(22) Filed: Mar. 30, 2010

(65) Prior Publication Data

US 2011/0001645 A1 Jan. 6, 2011

Related U.S. Application Data

(60) Provisional application No. 61/222,377, filed on Jul. 1, 2009, provisional application No. 61/222,381, filed on Jul. 1, 2009.

(51) Int. Cl.
*H03M 1/06* (2006.01)
(52) U.S. Cl. ............ 341/118; 341/120; 341/155
(58) Field of Classification Search ............ 341/118, 341/120, 155
See application file for complete search history.

(56) References Cited

U.S. PATENT DOCUMENTS

| | | | |
|---|---|---|---|
| 4,965,867 A | 10/1990 | Tsuchida et al. | |
| 5,239,299 A | 8/1993 | Apple et al. | |
| 6,225,928 B1 | 5/2001 | Green | |
| 6,392,575 B1 | 5/2002 | Eklund | |
| 6,900,750 B1 | 5/2005 | Nairn | |
| 6,999,012 B2 | 2/2006 | Kim et al. | |
| 7,250,885 B1 * | 7/2007 | Nairn | 341/141 |
| 7,253,762 B2 | 8/2007 | Huang et al. | |
| 7,292,170 B2 | 11/2007 | Kinyua et al. | |
| 7,312,734 B2 * | 12/2007 | McNeill et al. | 341/120 |
| 7,330,140 B2 | 2/2008 | Balakrishnan et al. | |
| 7,408,495 B2 * | 8/2008 | Stein et al. | 341/155 |
| 7,482,956 B2 * | 1/2009 | Huang et al. | 341/120 |
| 7,525,462 B2 | 4/2009 | Parthasarthy et al. | |
| 7,541,952 B1 * | 6/2009 | Sankaran et al. | 341/118 |
| 7,675,441 B2 * | 3/2010 | Sheng et al. | 341/120 |
| 7,808,408 B2 * | 10/2010 | Madisetti et al. | 341/118 |
| 2009/0021412 A1 | 1/2009 | Gustafsson | |
| 2010/0049483 A1 | 2/2010 | Johansson et al. | |
| 2011/0063149 A1 | 3/2011 | Kidambi | |

* cited by examiner

*Primary Examiner* — Khai M Nguyen
(74) *Attorney, Agent, or Firm* — Hamilton, Brook, Smith & Reynolds, P.C.

(57) ABSTRACT

A technique that randomizes a sample window over which one or more interleave mismatch corrections are made to a time interleaved analog to digital converter (TIADC).

23 Claims, 10 Drawing Sheets

RANDOMIZATION OF SAMPLE WINDOW IN CALIBRATION OF TIME-INTERLEAVED ANALOG TO DIGITAL CONVERTER

CROSS REFERENCE TO RELATED APPLICATION(S)

This application claims the benefit of U.S. Provisional Patent Application Ser. No. 61/222,377, filed Jul. 1, 2009, entitled "Randomization of Sample Window in Calibration of Time Interleaved Analog to Digital Converter and U.S. Provisional Patent Application Ser. No. 61/222,381 entitled "Meter and Freeze of Calibration of Time-Interleaved Analog to Digital Converter" filed on Jul. 1, 2009, the entire contents of each of which are hereby incorporated by reference.

BACKGROUND OF THE INVENTION

Time-interleaved Analog-to-Digital Converters (TIADCs) have received considerable attention in the recent past for applications that require very high sample rates, i.e., sample rates that cannot be provided by a single Analog to Digital Converter (ADC) core. In a TIADC system, a faster ADC is obtained by combining two or more slower ADCs operating in parallel. Ideally, the slower ADCs should each have the same offset, the same gain, and the same uniform sample instants. In practice, however, due to fabrication errors, component mismatches, temperature variations, mechanical strain, environmental perturbations, etc., this requirement is difficult to achieve. The resulting errors degrade the performance of the TIADC system, thus making the estimation and correction of these errors imperative to improve performance.

Various interleave error correction techniques are known. However, those have been observed to have limitations in practice.

SUMMARY OF THE INVENTION

In one embodiment the length of a sample window over which an interleave correction algorithm determines one or more mismatch errors is randomized.

The interleave correction may be for errors in sample time, gain, offset or other mismatches between two or more ADC cores.

The sample time window may be adjusted concurrently or independently for the various corrections.

Randomization of the sample window is believed to create an equal probability density of calculating error over a given segment of a signal. In other words, the sample points and input signals are temporarily decorrelated by randomization of the window size. This allows the system to integrate over a much shorter period of time.

The technique of randomizing the sample window improves the general applicability of blind and background interleave calibration. While it significantly decreases sample rate divided by four sensitivity, it also provides improved performance across all frequencies. While these effects are observed in detail for a two-channel interleaved ADC system herein, the concept scales directly to M-way interleaved ADC systems.

In one specific embodiment for a two-channel TIADC with a 500 MHz sample rate, without randomization, performance noticeably degraded for a sinusoidal input ~4 MHz away from an input signal having frequency content at the sample rate divided by four. With randomization, this sensitivity window was improved by nearly two orders of magnitude, to ~50 kHz.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF PREFERRED EMBODIMENTS

A description of example embodiments of the invention follows. The example described here in detail is specifically a two-channel time-interleaved analog-to-digital converter (TIADC). Signal processing elements in example TIADC can detect and correct for (1) offset error, (2) gain error, and/or (3) sample time error. According to the teachings herein, these signal processing elements use a randomized sample window size over which to detect and/or correct such errors.

It should be understood that the signal processing elements described herein may be embodied as discrete analog or digital circuits, as program code executing in a programmable digital processor, a combination of one or more of the same, or in other ways.

Figure 1:
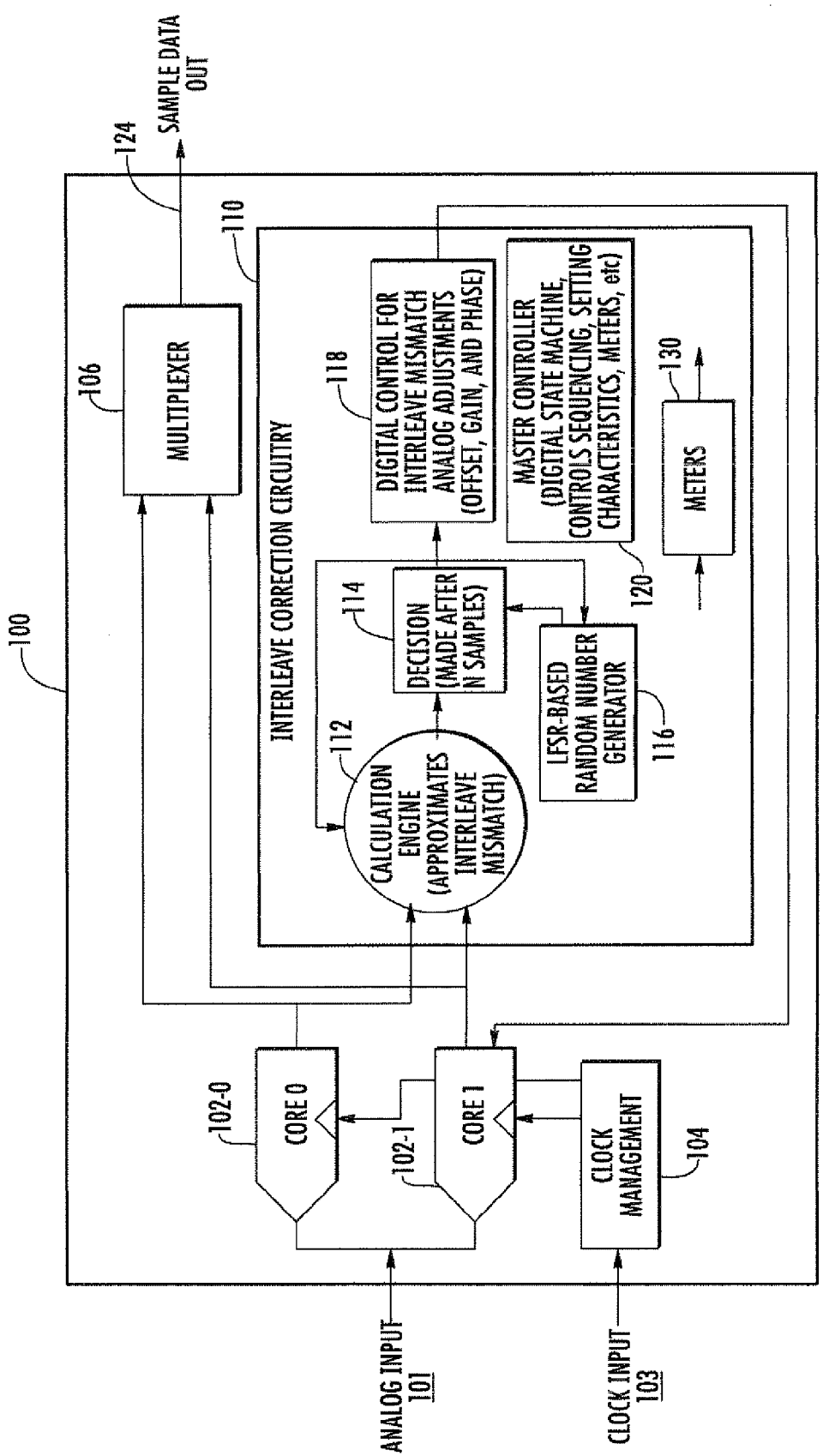
FIG. 1 is a block diagram of a two-channel time-interleaved analog-to-digital converter (TIADC) to which sample size window randomization is applied.

Turning attention now to FIG. 1, a TIADC 100 in one embodiment includes two ADC cores 102-0, 102-1, a clock management circuit 104, a multiplexer 106, and interleave correction circuitry 110. The cores 102 are controlled by the clock management circuit 104 to take samples of the analog input 101 at interleaved points in time. In the illustrated embodiment, each core 102 may be running at 250 Mega-Samples Per Second (MSPS) and provide 12 bits of resolution. Also, while a two-channel TIADC is illustrated, it should be understood that the techniques described herein can be generalized to a TIADC system 100 having M cores, where M is typically a factor of two.

Each of the cores 102 may be a charge-domain, successive approximation pipelined ADCs such as those described in U.S. patent application Ser. No. 12/074,706 and U.S. Pat. No. 7,079,067, each of which are also incorporated herein by reference in their entirety. Briefly, in such ADC cores 102, first and second pipeline stages incorporate charge-redistribution, charge-comparison, and charge-redistribution-driver circuits to provide multiple bits of analog-to-digital conversion at high sample rates.

The outputs of the two individual cores 102-0, 102-1 are then combined by multiplexer 106 to result in the digital sampled data output signal 124.

The interleave correction circuitry 110 analyzes the characteristics of the two ADC core 102 outputs, generating real time updated estimates of the mismatch between them. The result of these mismatch calculations over a window having a length equal to some number, N, of ADC output samples, is then used to update fine-granularity adjustments for offset, gain, and sample time mismatch.

In the example of FIG. 1, the core 1 ADC 102-1 is adjusted to match the core 0 ADC's 102-0 offset, gain, and sample time. However, it is also possible to adjust the core 0 ADC 102-0 to match core 1 ADC 102-1, the adjusted core being selectable, or to allow both cores 102 to be adjusted in alternating fashion thereby doubling the available adjustment range.

Interleave correction circuitry 110 includes a calculation engine 112, a decision block 114, a random number generator 116, a digital controller for interleave mismatch (analog adjustments) 118, a master controller 120, and optional analog input meter(s) 130. In general, the calculation engine 112 approximates the mismatch between the interleaved cores 102. The mismatch approximation may be made for one or more of offset, gain, sample time, or other mismatches between the two cores 102.

The random number generator 116 may include a linear feedback shift register based random number generator. That random based number is then used as the window size, N, over which to operate the decision block 114. In particular, decision block 114 first accumulates a number of ADC samples, N, output by the calculation engine 112. This result, now accumulated over the random window size N, is then fed to a digital control block 118. Digital control block 118 then implements the adjustments to offset, gain and phase.

In one embodiment, the adjustments for offset, gain, and phase are made independently and sequentially. For example, during a first time frame, an offset mismatch is calculated and corrected. During a next time frame, for example, the gain offset is estimated and corrected. And finally, during the third time frame, a phase offset is estimated and corrected.

However, in another embodiment, these various adjustments are determined in parallel.

It should be understood that the particular mismatches corrected, and the particular corrections implemented, are not particularly germain to the core concept herein of allowing the corrections to operate over a randomized sample window. However, in one preferred embodiment, an adaptive algorithm for the calculation engine 112 is used to correct offset, gain and phase mismatch errors in a two-channel TIADC. This adaptive approach treats each type of error as independent of the others. In one implementation, the adaptation can be a mixed-signal process wherein the estimation of the various errors is carried out in the digital domain while the correction is carried out in the analog domain. As one example, offset can be estimated by assuming that the average offset value of the two ADCs 102 produces a tone at DC while the difference in the offset produces a tone at a Nyquist frequency. The correction then minimizes the tone at Nyquist which depends upon the difference in the offset between the two ADCs 102. This is achieved by making the offset on one of the ADCs equal to that of the other. For gain error estimation and correction, it can be assumed that the difference in gain between the two ADCs 102 produces an image tone reflected around the Nyquist frequency. Phase error can be assumed to produce an image tone reflected around the Nyquist frequency which is $\pi/2$ out of phase with the tone produced by the gain error. Consequently, an adaptive algorithm is used to minimize the differences in auto-correlation between two adjacent pairs of time samples.

More details for how to implement one such blind and background technique for the calculation engine 112 to determine offset, gain, and phase mismatch between the two ADCs 102 is described in a co-pending U.S. patent application Ser. No. 12/419,599 filed Apr. 7, 2009 entitled "Error Estimation and Correction In A Two-Channel Time-Interleaved Analog-to-Digital Converter", the entire contents of which are hereby incorporated by reference.

That same patent application also describes details of one way to implement digital control 118 for mismatch correction.

The master controller 120 is a digital finite state machine that handles sequencing, settling characteristics and meter controls for the interleave mismatch correction circuitry 110.

An important characteristic of this system 100 is that the starting sample for each error approximation by calculation engine 112 is random with respect to the starting sample for a following calculation engine 112 error approximation. Specifically, it can make the number of samples analyzed before a decision is made a randomly generated number N, which is updated to a new random number every time an update is made to the analog adjustments.

The importance of randomizing the number of samples which the calculation engine 112 uses is embedded in a basic assumption behind the correction schemes: that the analog input and sample clock input are uncorrelated. This assumption is made to allow certain blind and background calibration techniques to correctly remove interleave artifacts.

An analog input 101 that has significant frequency content close to the sample clock frequency divided by four (for a two-channel interleaved ADC system such as that shown in FIG. 1) is, by definition, well correlated with the sample clock 103 itself. This potential error condition exists at every Nyquist zone for the unit ADCs. For example, in a four channel TIADC, it occurs at a frequency corresponding to the sample rate over eight. Such correlation of analog input 101 to sample clock 103 will cause error calculations to produce inaccurate results, dominated in fact by the analog input signal itself rather than the interleave mismatch errors (and subsequently causing very poor interleave performance). Real time randomizing of the number of samples over which the calculation engine performs calculations breaks up this correlation of analog input 101 and sample clock 103, allowing the correction circuitry 110 to successfully correct interleave errors for many analog inputs that it could not otherwise correct. In this way, randomization improves the general applicability background interleave mismatch calibration (and perhaps many other) interleaved algorithms.

As mentioned above, the size of the window, N, is typically set differently for each of the gain, phase, and offset corrections. The number, N, may range in the illustrated embodiment (e.g. each core at 250 MSPS and 12 bits), from 64 to 256 k samples long. The ranges can also be different for each adjustment—e.g., the sample window N for offset might range from 8 to 255 k, for gain from 64 to 255 k, and for phase from 64 to 64 k samples.

The window sizes are preferably selected to have a base length that is a predetermined minimum length. In practice, N should be selected to be short enough to ensure that integration time is relatively fast (for example, less than one second) but while still being long enough so that variations are not sporadic (and the result not too noisy). The selection of N depends on the maximum amount of expected mismatch, as well as how fast the particular correction algorithms chosen can be expected to converge.

In one embodiment, the calculation engine 112 sequentially calculates statistics for offset, gain and sample time individually. In that implementation, offset is first determined over the N samples. Once the correct number of samples has been analyzed, a decision is made and the offset adjustment is updated. Next, the calculation engine 112 calculates statistics for gain over a certain number of samples which would typically be different from the window size used for offset. Once the correct number of samples has been analyzed for gain, a decision about gain is made and then a gain adjustment is updated. Next, the calculation engine 112 determines statistics for sample time skew (phase) over a certain number of samples, based on a new N value. Once the correct number of samples has been analyzed, a decision is then made and the phase adjustment is updated. The process then starts all over again with a new offset calculation and a different N than was used the first time.

These adjustments can also be performed in parallel. If they are done serially, it reduces the amount of power consumed by the circuitry. If they are done in parallel, better performance can be realized.

In one embodiment, the correction for gain and phase can be determined over the same window, with offset being determined over a different window, to provide better 1/f noise performance.

Meters 130 measure the input signal(s) for characteristics that can obscure the interleave artifacts and thus reduce the effectiveness of the interleave correction 110. When meters 130 indicate such a condition, they output signals to master controller 120 which in turn controls digital control 118 to stop its interleave mismatch adjustment, (i.e., "freeze" where it is). The meters 130 may operate on the analog signals directly and/or may operate on the outputs of ADC cores 102 in the digital domain. Similarly, the mismatch corrections themselves can either be made to the analog signals, in the digital domain, or some combination thereof. For example, gain and offset can be simpler to correct in the digital domain.

More details of the meters can be found in the co-pending provisional application filed on the same date and referred to on the first page herein.

Figure 3:
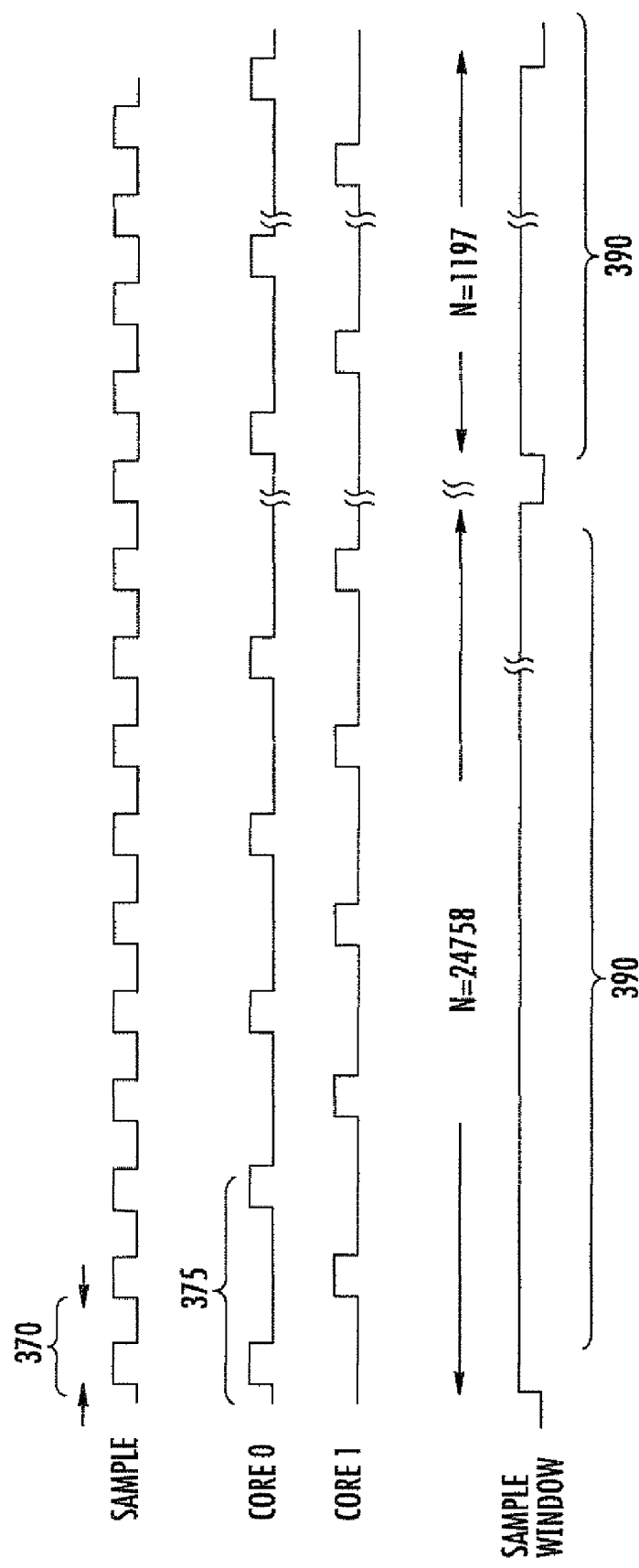
FIG. 3 is a timing diagram that illustrates an example relationship between the sample clock and random window lengths.

FIG. 3 illustrates the relationship between the input sample clock and the random window size, N. For example, in a first iteration, the window size is 24758 samples and in a next iteration it is 1197 samples.

Figure 2A:
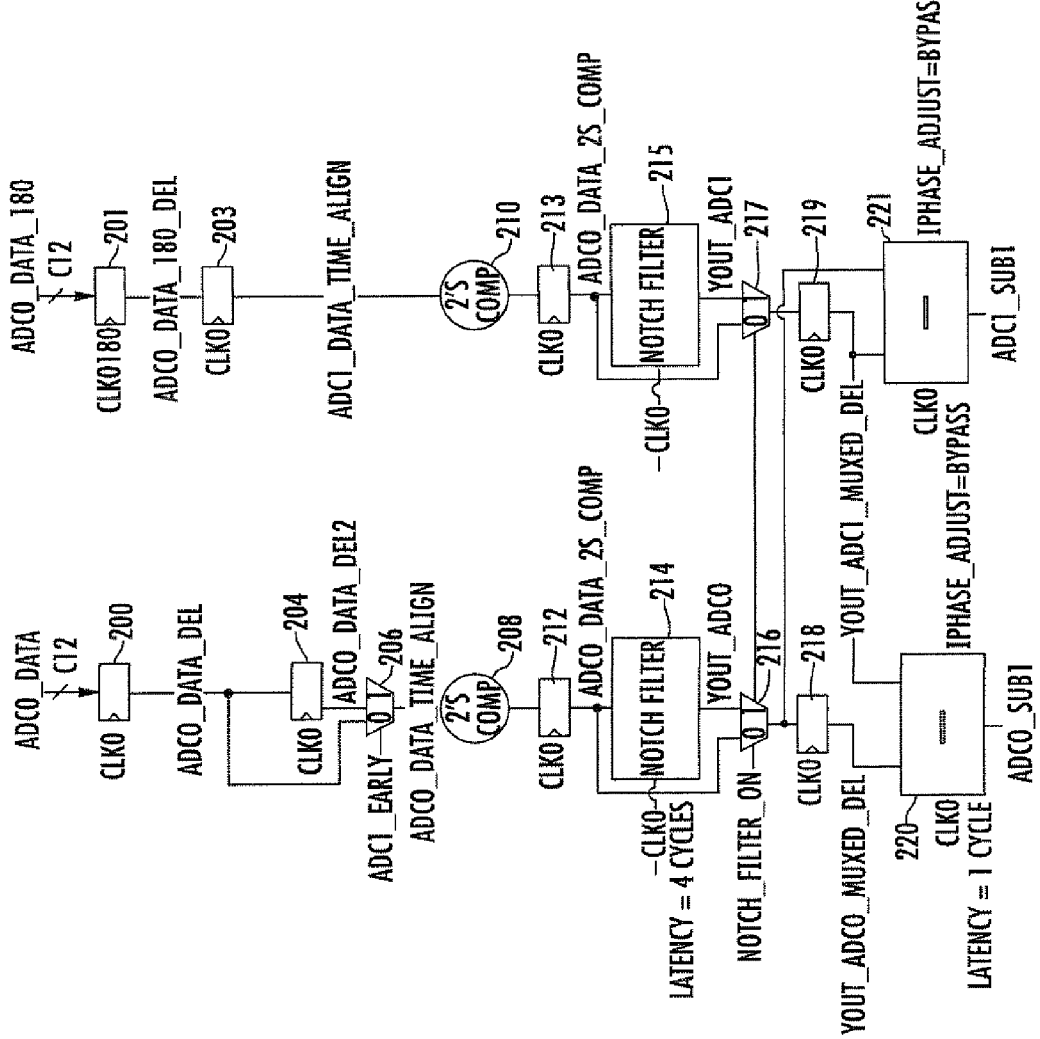
FIGS. 2A and 2B are a more detailed flow diagram of an implementation.
Figure 2B:
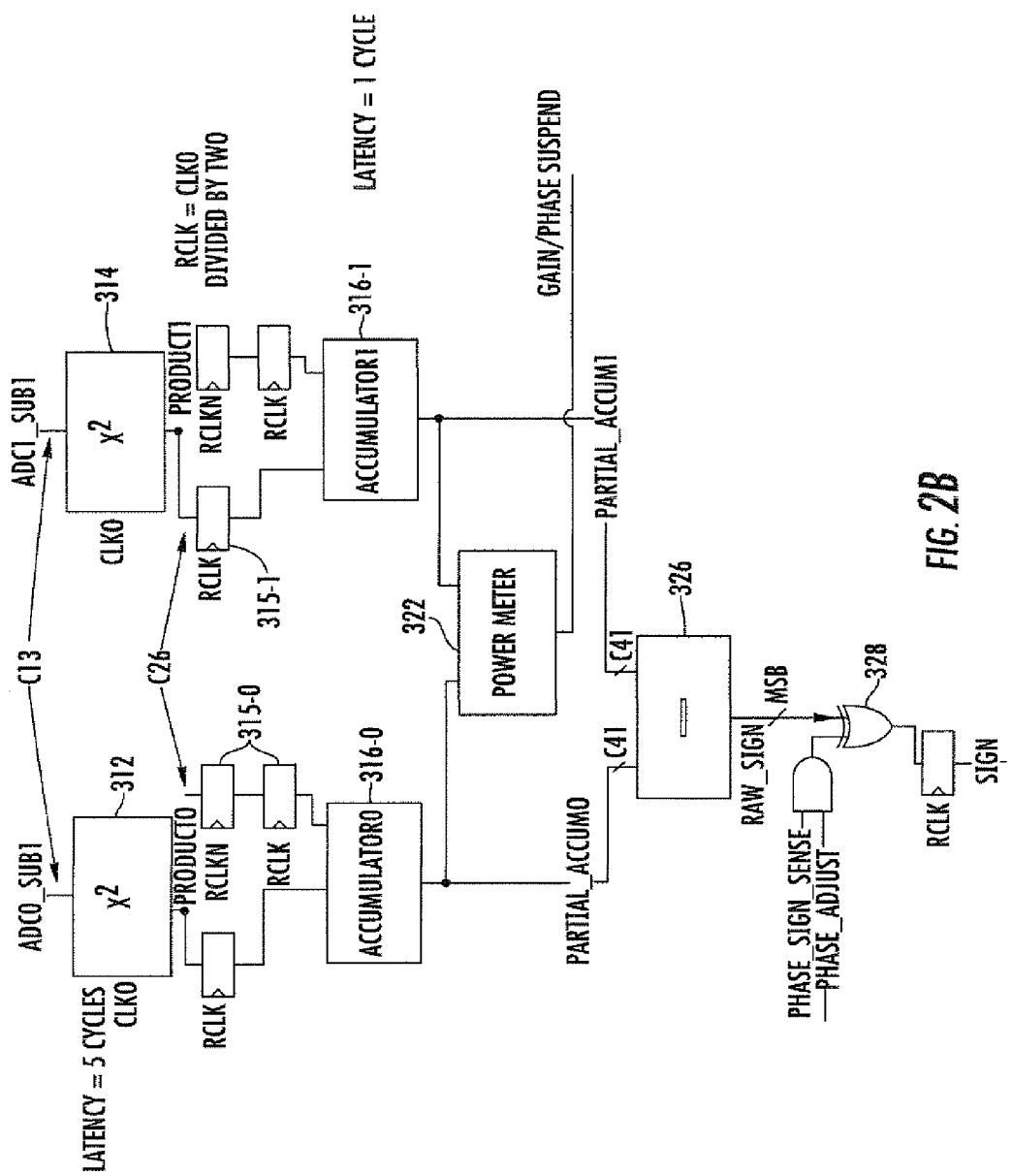

FIGS. 2A and 2B are a more detailed circuit level implementation of portions of the interleave correction circuitry 110. This example implements interleave correction to the analog signals. In FIG. 2A, the first few register blocks 200, 201, 202, 203, receive samples from the respective ADC cores 102-0 and 102-1 (respectively shown on the left and right signal flow paths) and performs time-alignment. Multiplexer 206 is then used to ensure that the samples from ADC 0 always precede the samples from ADC 1 in time.

Notch filters 214, 215 are then used to remove sample signal artifacts close to the sample clock over four (or other frequency that would be correlated with the sample clock). These filters can be switched on or off by multiplexers 216, 217 depending upon the desired effect.

The correction function then implements phase adjustment via blocks 220, 221, and offset adjustment via squaring blocks 312, 314.

Accumulators 316-0, 316-1, 316-2 and 316-3 then accumulate the N samples over which the correction will be implemented.

A power meter 322 measures signal power in the two paths and outputs a signal that can be used to suspend gain and phase correction.

Blocks 326 and 328 then provide phase correction. A final output indicates the adjustment at logic gate 328.

FIGS. 2A and 2B also illustrates one example of how the various meter 130 outputs of FIG. 1, if present, can be used to control the digital control block 118 in more detail.

In particular, when a meter indicates that a phase correction should be disabled, inputs are provided to disable blocks 312 and 314.

When a meter 130 indicates that a gain correction should be suspended, inputs are provided to disable power meter block 322.

The plots of FIGS. 4 through 7B are the results of various simulations of the techniques described herein.

Figure 4:
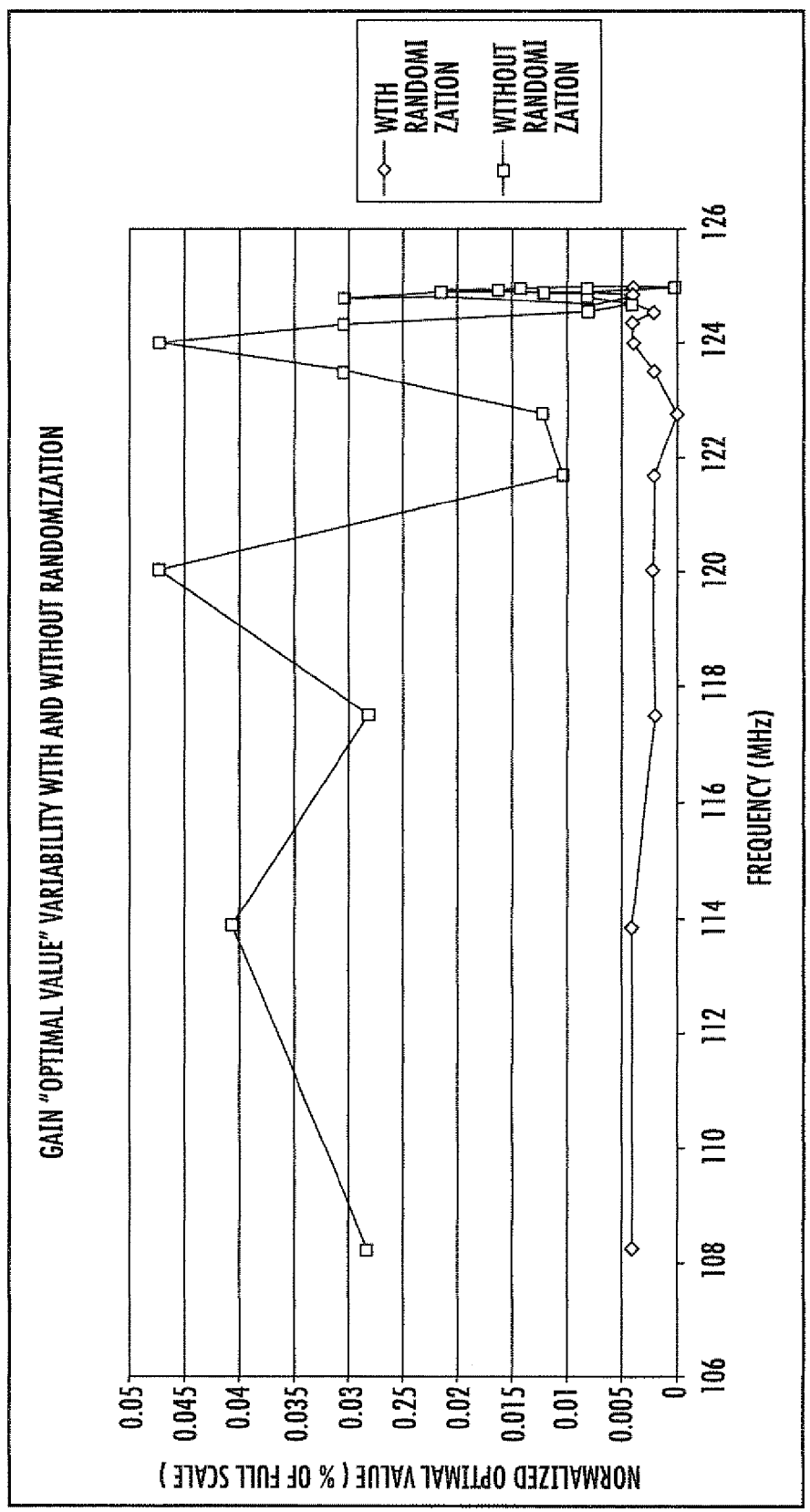
FIG. 4 illustrates normalized optimal value of gain versus frequency with and without randomization of the sample window size.

FIG. 4 illustrates a possible improvement in gain control using the techniques described herein. Shown there is a plot of normalized optimum value of gain versus frequency. With randomization, there is seen a much reduced variation in gain.

Figure 5:
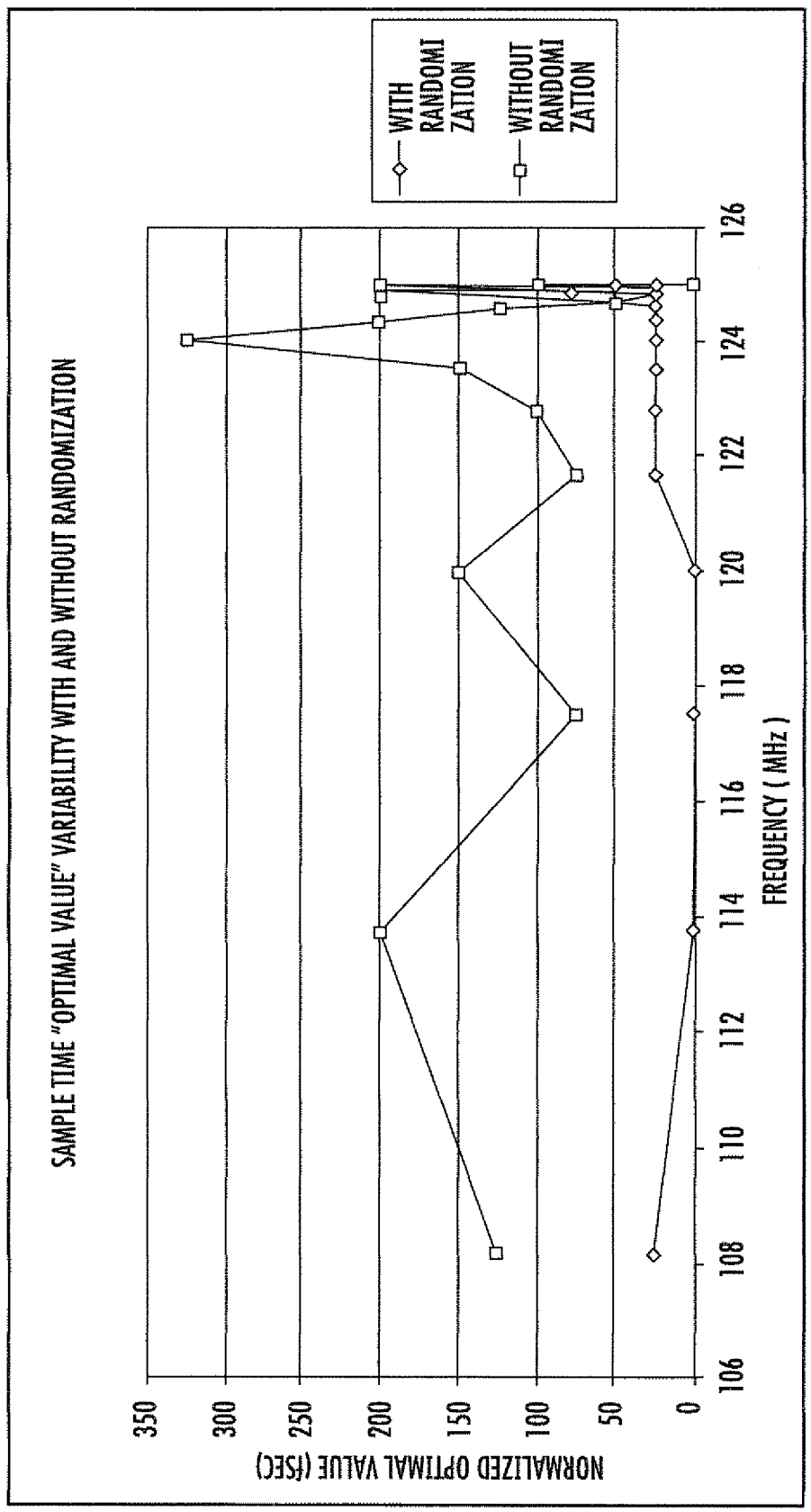
FIG. 5 shows a similar graph for sample time.

FIG. 5 is a similar graph of normalized optimal value of sample time versus frequency with and without randomization. A marked possible improvement is also evident here as well.

Figure 6:
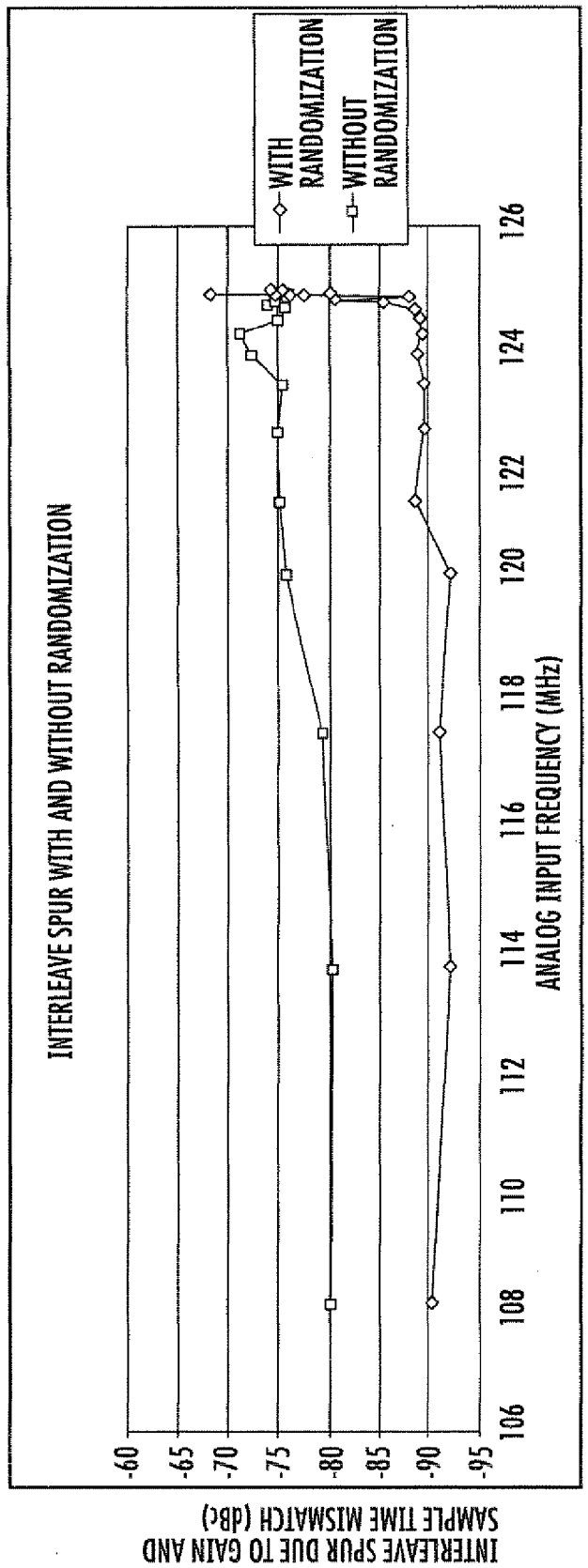
FIG. 6 shows interleaved spur magnitudes.

FIG. 6 plots interleave spur due to gain and sample time mismatch over frequency. Again, illustrating a possible 10 dBC improvement over a range of operating frequencies.

Figure 7A:
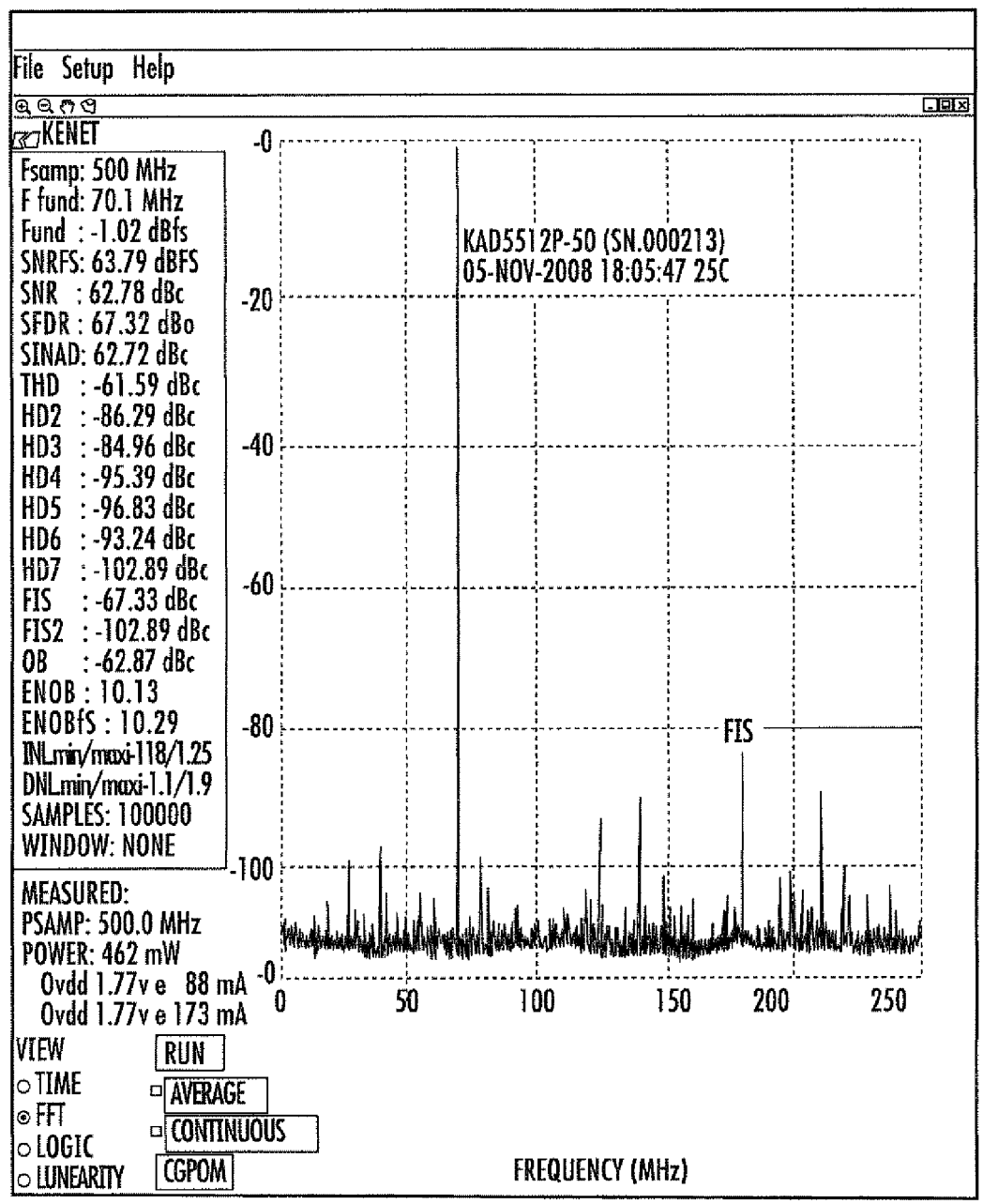
FIGS. 7A and 7B illustrate a reduction of spurs in the frequency domain.
Figure 7B:
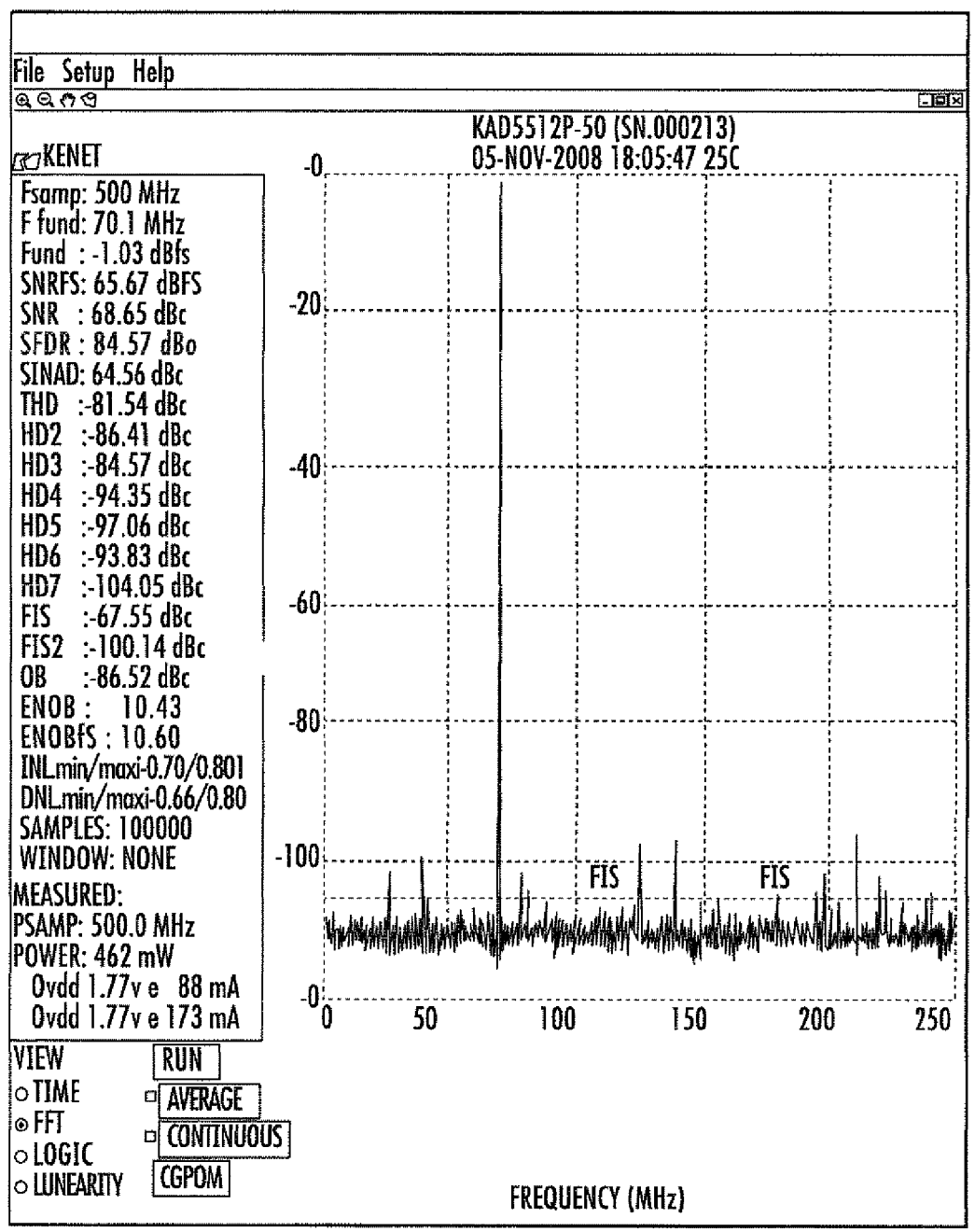

Comparing FIGS. 7A and 7B provides a further appreciation for the possible advantages of the invention showing a marked reduction in spurious signals. Compare the spur at approximately 180 MHz at ~68 dBC without randomization and the much reduced ~84 dBC spur in the randomized case.

Figure 8:
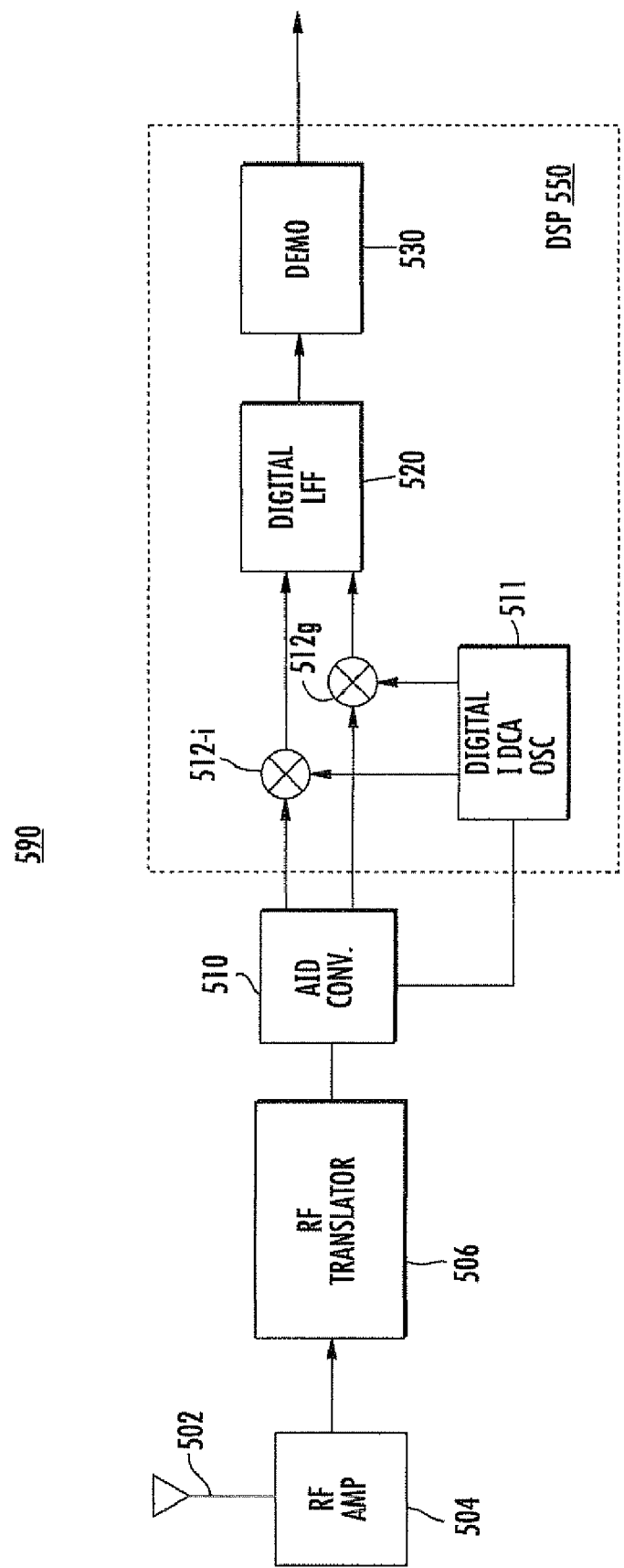
FIG. 8 is a high level diagram of a digital radio receiver that uses the TIADC of FIG. 1.

One particular use of the ADC of FIG. 1 is to implement a digital radio receiver as generally shown in FIG. 8. A Radio Frequency (RF) signal is received at a radio frequency RF amplifier 504. The RF signal may have originated from an antenna 502, such as in a wireless end application, or may have been provided via a wire or optic fiber, such as may be in a cable modem or other wired communication signal interface. The amplified RF signal is then fed to an RF translator 506 to down-convert the amplified RF signal to an intermediate frequency (IF). After the RF translator 506 (which may be optional) the ADC 510 is then used to digitize the IF input into digital samples for subsequent processing. A digital local oscillator 511 may operate digital mixers 512-$i$ and 512-$q$ to provide in-phase and quadrature samples thereof. A digital low pass filter 520 limits the frequency content of resulting signal to the desired bandwidth. A demodulator 530 then recovers the original modulated signal. One or more of the operations of the digital local oscillator 511, mixers 512, low pass filter 520 and/or demodulator 530 may be implemented in a digital signal processor 550. The recovered signal may then be further processed, e.g., converted back to an analog baseband signal or the like, depending on the specific end application of the digital receiver.

While this invention has been particularly shown and described with references to example embodiments thereof, it will be understood by those skilled in the art that various changes in form and details may be made therein without departing from the scope of the invention encompassed by the appended claims.

What is claimed is:

1. A method for correcting errors in a time-interleaved analog to digital converter (ADC) comprising:
   sampling and holding an input signal with at least a first and second ADC core at alternating sample time intervals to produce at least a first and a second digital signal;
   estimating at least one mismatch error from samples of the first and second digital signals;

accumulating such mismatch error estimates over a time window containing a randomized number of samples of the first and second digital signals to determine a correction signal; and applying the correction signal to at least one of the first or second ADC cores to correct at least one mismatch error.

2. The method of claim 1 further comprising:
interleaving the first and second digital signals with a multiplexer to form a digital representation of the input signal.

3. The method of claim 1 wherein the mismatch error is at least one of offset, gain, or sample-time error.

4. The method of claim 1 wherein the step of estimating further comprises estimating at least two different mismatch errors.

5. The method of claim 4 wherein the step of accumulating such mismatch error further comprises accumulating the least two different mismatch errors over at least two different respective time windows.

6. The method of claim 5 wherein the step of accumulating such mismatch error further comprises the step of accumulating the at least two different mismatch errors sequentially.

7. The method of claim 4 wherein the step of accumulating further comprises accumulating the least two different mismatch errors over the same time window for each mismatch error.

8. The method of claim 7 wherein the step of accumulating further comprises accumulating the at least two different mismatch errors in parallel.

9. The method of claim 1 wherein the randomized number of samples chosen for the window ranges from a minimum window duration determined by a desired error convergence time to a maximum window duration determined by a desired maximum noise.

10. The method of claim 1 wherein the steps of (a) estimating at least one mismatch error (b) accumulating such mismatch error estimates over a time window containing a randomized number of samples are performed in a programmable data processor.

11. The method of claim 1 additionally comprising:
determining the randomized number of samples from the output of a linear feedback shift register.

12. An analog to digital converter apparatus comprising:
a first analog to digital converter core connected to receive an analog input signal and to output a first converted digital signal;
a second analog to digital converter core connected to receive the analog input signal and to output a second converted digital signal;
a random number generator, for generating a random number, N; and
an interleave error accumulator, for accumulating at least one interleave mismatch error over an N sample time window of the first and second converted digital signals, to produce an interleave error estimate accumulated over a random number of samples.

13. The apparatus of claim 12 further comprising:
an error adjuster, for adjusting at least one of the first or second analog to digital converter cores based on the interleave error estimate, to produce an adjusted converted digital signal.

14. The apparatus of claim 12 wherein the random number generator generates a new random number used during a subsequent operation of the interleave error accumulator.

15. The apparatus of claim 12 further comprising:
combining the first and second converted digital signals to produce an interleaved converted digital signal.

16. The apparatus of claim 12 wherein the at least one interleave mismatch error is one or more of offset, gain, or sample-time error.

17. The apparatus of claim 16 wherein the interleave error accumulator further accumulates at least two different interleave mismatch errors over at least two different respective sample time windows for two different values of N.

18. The apparatus of claim 17 wherein the interleave error accumulator further accumulates the at least two different mismatch errors sequentially.

19. The apparatus of claim 16 wherein the interleave error accumulator further accumulates at least two different mismatch errors over the same sample time window, N, for each of the at least two different mismatch errors.

20. The apparatus of claim 12 wherein the number of samples, N, chosen for the window ranges from a minimum window duration determined by an error convergence time to a maximum window duration determined by a desired maximum noise.

21. The apparatus of claim 12 wherein the random number generator and interleave error accumulator are implemented as computer program code in a programmable data processor.

22. The apparatus of claim 12 further wherein the random number generator is a linear feedback shift register.

23. The apparatus of claim 12 additionally comprising:
a clock circuit, connected to the first and second analog to digital converter cores, to thereby use the samples of the first converted digital signal to be interleaved in time with the samples of the second converted digital signal.

* * * * *